United States Patent
Moriyama et al.

(10) Patent No.: US 7,385,845 B2
(45) Date of Patent: Jun. 10, 2008

(54) COMPOSITE STORAGE CIRCUIT AND SEMICONDUCTOR DEVICE HAVING THE SAME

(75) Inventors: Katsutoshi Moriyama, Saga (JP); Hironobu Mori, Nagasaki (JP); Hisanobu Tsukazaki, Nagasaki (JP)

(73) Assignee: Sony Corporation (JP)

( * ) Notice: Subject to any disclaimer, the term of this patent is extended or adjusted under 35 U.S.C. 154(b) by 311 days.

(21) Appl. No.: 10/503,442

(22) PCT Filed: Feb. 7, 2003

(86) PCT No.: PCT/JP03/01349

§ 371 (c)(1),
(2), (4) Date: Aug. 4, 2004

(87) PCT Pub. No.: WO03/067602

PCT Pub. Date: Aug. 14, 2003

(65) Prior Publication Data

US 2005/0077543 A1    Apr. 14, 2005

(30) Foreign Application Priority Data

Feb. 8, 2002    (JP) ............................ 2002-033166

(51) Int. Cl.
*G11C 16/04*    (2006.01)
(52) U.S. Cl. ........................ 365/185.08; 365/185.28; 365/229
(58) Field of Classification Search .......... 365/185.08, 365/226, 229, 228, 185.28
See application file for complete search history.

(56) References Cited

U.S. PATENT DOCUMENTS 4,408,303 A * 10/1983 Guterman et al. ..... 365/185.07
5,097,449 A * 3/1992 Cuevas ................... 365/185.07
5,357,459 A * 10/1994 Chapman ..................... 365/149
5,557,272 A * 9/1996 Riggio, Jr. ................... 341/100
5,721,481 A * 2/1998 Narita et al. ................. 320/111
6,016,516 A * 1/2000 Horikiri ...................... 719/330

(Continued)

FOREIGN PATENT DOCUMENTS

EP    0 247 739    12/1987

(Continued)

OTHER PUBLICATIONS

EPO Search Report dated Jun. 14, 2005.

(Continued)

*Primary Examiner*—Thong Q Le
(74) *Attorney, Agent, or Firm*—Rader Fishman & Grauer PLLC; Ronald P. Kananen

(57) ABSTRACT

The object of the present invention is to provide a composite storage circuit capable of executing a writing operation and reading operation at high speed, and as the result of that, a semiconductor apparatus capable of realizing an instant-on function and an instant-off function is provided. The composite storage circuit is constituted of a volatile storage circuit and a non-volatile storage circuit connected in parallel, and the same information as storage information in the volatile storage circuit is stored in the non-volatile storage circuit. Moreover, as a power supply to the volatile storage circuit decreases, storage information in the volatile storage circuit is written in the non-volatile storage circuit. Further, after a power failure or a decreased power supply, storage information from the non-volatile storage circuit is returned to the volatile storage circuit upon restarting power feeding. Further, a semiconductor apparatus is constituted by having the composite storage circuit described above.

23 Claims, 2 Drawing Sheets

U.S. PATENT DOCUMENTS

| | | | | |
|---|---|---|---|---|
| 6,102,963 | A * | 8/2000 | Agrawal | 716/17 |
| 6,438,708 | B1 * | 8/2002 | Shinichi et al. | 714/15 |
| 6,547,147 | B1 * | 4/2003 | Shibata et al. | 235/472.01 |
| 6,639,834 | B2 * | 10/2003 | Sunaga et al. | 365/185.05 |
| 6,851,012 | B2 * | 2/2005 | Yamashima | 711/101 |
| 6,904,541 | B1 * | 6/2005 | MacArthur et al. | 714/14 |
| 2002/0181275 | A1 * | 12/2002 | Sunaga et al. | 365/171 |

FOREIGN PATENT DOCUMENTS

| | | |
|---|---|---|
| JP | 56 000099 | 1/1981 |
| JP | 56-99 A | 6/1981 |
| JP | 58-068300 | 4/1983 |
| JP | 62-256296 A | 11/1987 |
| JP | 02-081398 | 3/1990 |
| JP | 02100743 A * | 4/1990 |
| JP | 04 042496 | 2/1992 |
| JP | 4-42496 A | 2/1992 |
| JP | 04 141883 | 5/1992 |
| JP | 4-141883 A | 5/1992 |
| JP | 07-028712 | 1/1995 |
| JP | 08-147073 | 6/1996 |
| JP | 08 180672 | 7/1996 |
| JP | 8-180672 A | 7/1996 |
| JP | 08 264728 | 10/1996 |
| JP | 8-264728 A | 10/1996 |
| JP | 2000-194607 | 7/2000 |
| JP | 2001-199556 * | 6/2001 |

OTHER PUBLICATIONS

Japanese Office Action; Application No. 2002-033166; Dated: Feb. 6, 2007.

* cited by examiner

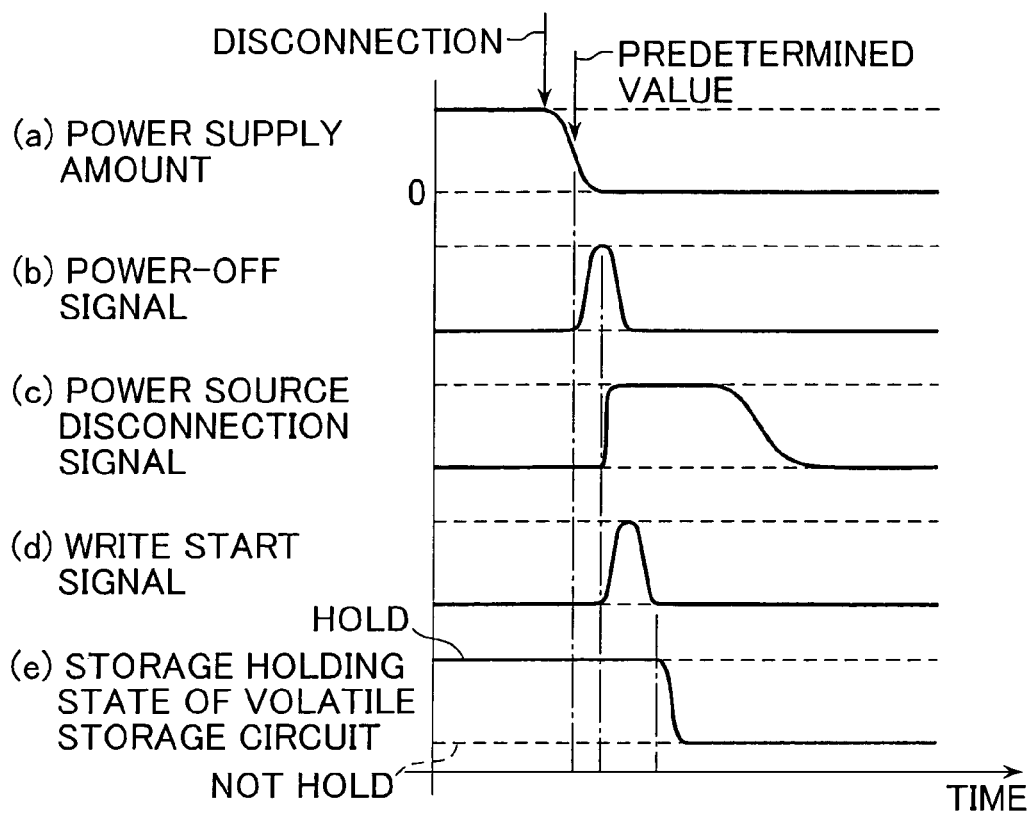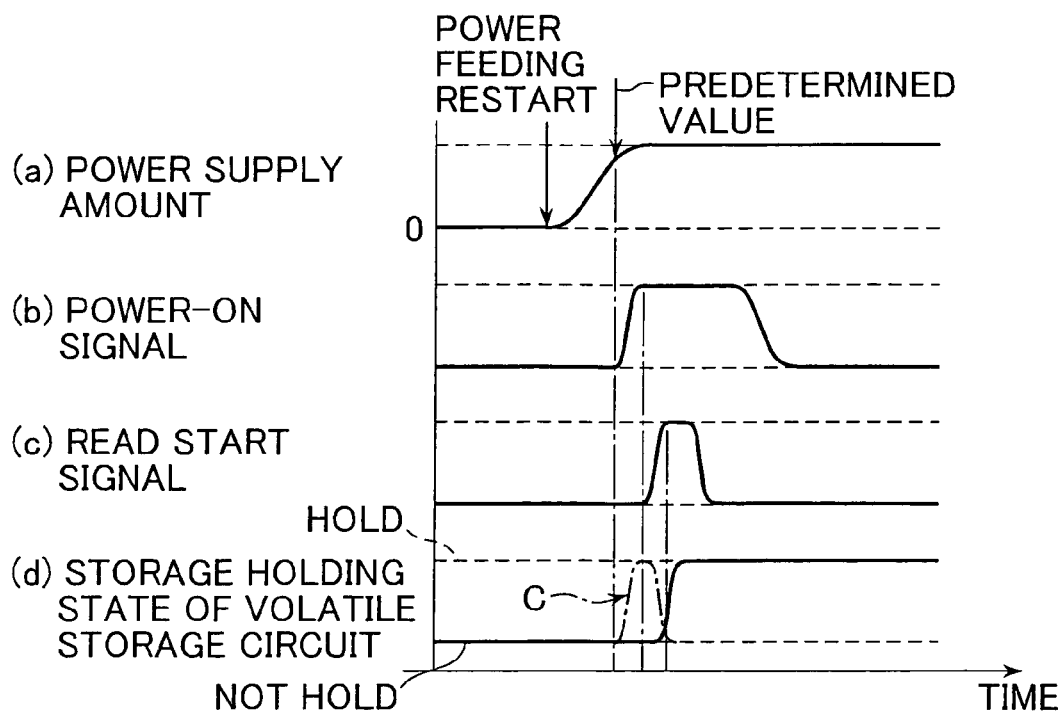

COMPOSITE STORAGE CIRCUIT AND SEMICONDUCTOR DEVICE HAVING THE SAME

TECHNICAL FIELD

The present invention relates to a composite storage circuit constituted of a volatile storage circuit and a non-volatile storage circuit connected in parallel and to a semiconductor apparatus having the composite storage circuit.

BACKGROUND OF THE INVENTION

Conventionally, in an electronic computer of high versatility, such as a personal computer, when the electronic computer is to be activated to perform jobs, after the main power source is turned on, an initial start-up job starts so that the electronic computer executes a preset start-up program and reads files necessary for the start-up into the main storage of the electronic computer to enter a usable state.

More specifically, of a large number of files stored in an auxiliary storage, such as a hard disk, files necessary for the start-up are read into a main memory serving as the main storage of the electronic computer and further into a cache memory of a system LSI chip to thereby allow a necessary input to be acknowledged and complete the initial start-up job.

Since the initial start-up job is influenced by the processing speed of the electronic computer, it generally takes about several tens seconds to several minutes.

When a shut-down operation of the electronic computer is performed after the completion of jobs, the electronic computer does not turn off the main power source at once, but an operation halt job starts to terminate a job of a running program, if any, and after the program is terminated, to write information of a file used by the program into a hard disk and to allow the main power source to be turned off after it is confirmed that the state of the electronic computer permits turn-off of the main power source.

This operation halt job is also influenced by the processing speed of the electronic computer, so that it takes at least about several seconds to several tens seconds.

The operation halt job is performed in order to make it easy to generate the start-up state for the next start-up and to specify the initial start-up state in which only a minimum of programs necessary for the next start-up are activated. On the other hand, the initial start-up job is configured to start up the electronic computer smoothly by performing a start-up process in accordance with initial start-up state information for the next start-up specified by the preceding operation halt job.

However, since information stored in respective storage circuits, such as registers, latches, flip-flop's and counters, in a system LSI chip, which is the central processing unit of the electronic computer, is not necessary as the initial start-up state information for the next start-up, the operation halt job does not store this information as a file in a hard disk. Moreover, since each storage circuit, such as a register, a latch, a flip-flop and a counter is volatile, the information stored in each storage circuit is extinguished upon stopping of power feeding to the system LSI chip.

Instead of a normal shut-down operation, if a power failure occurs or a plug of the electronic computer is erroneously pulled out of an outlet and power feeding is stopped during the operation of the electronic computer, each device constituting the electronic computer is stopped at once so that a system-down occurs.

A means for storing information stored when the system-down occurs in volatile storage circuits, such as registers, latches, flip-flop's and counters in the electronic computer, particularly in the system LSI chip, is not presently provided. Therefore, if the system-down occurs, the information of a job status in the electronic computer before occurrence of the system-down is extinguished.

In order to prevent the loss of the job state information by the system-down, the electronic computer automatically and periodically forms back-up files of the files used by jobs and stores the back-up files in a hard disk. When the system-down occurs and after the electronic computer is restarted, the latest back-up files are read so that the state approximate to the state when the system-down occurred can be recovered.

When the system-down occurs, the electronic computer is stopped without executing the operation halt job. Therefore, the initial start-up state for the next start-up cannot be specified and a smooth next start-up is hindered. Also, in this case, by using proper back-up files, for example, the initial start-up state information for the preceding start-up, a smooth restart can be executed.

However, the conventional electronic computer described above cannot realize an instant-on function of reproducing the preceding use state immediately after the main power source is turned on and an instant-off function of turning off the main power source immediately after the shut-down operation. There arises, therefore, the problem that it takes a very long time to perform the start-up and shut-down operations.

Similarly, when the power source is turned off by a power failure or the like, information stored in storage circuits, such as registers, latches, flip-flop's and counters in the system LSI chip, is not held. This results in the problem that it is not possible to make the electronic computer perfectly recover the state immediately before turn-off, after the restart followed by the system-down.

The above-described problems can be solved by using non-volatile storage circuits capable of maintaining storage information even after stopping power feeding, as the storage circuit, such as registers, latches, flip-flops and counters in the system LSI. However, if registers, latches, flip-flop's and counters are constituted of non-volatile storage circuits, as practical problems, operations such as information write to the storage circuits and information read from the storage circuits are slower than when the volatile storage circuits are used, and a power consumption is larger than that of the volatile storage circuits. Therefore, if the system LSI chip is constituted of non-volatile storage circuits, there arises the problem that it is difficult to improve the performance of the system LSI chip.

DISCLOSURE OF THE INVENTION

In order to solve the above-described problems, in a composite storage circuit according to at least one embodiment, the storage circuit is constituted of a volatile storage circuit and a non-volatile storage circuit connected in parallel, and the same information as storage information in the volatile storage circuit is stored in the non-volatile storage circuit. Specifically, the volatile storage circuit is used for normal information read and write, whereas if storage information in the volatile storage circuit tends to be extinguished in a power feeding stop state, the same information as the storage information in the volatile storage circuit is stored in the non-volatile storage circuit. It is therefore possible to continue to hold storage information even upon stopping of power feeding while the information read and write operations are maintained at high speed.

In the invention according to at least one embodiment, a composite storage circuit is configured that as a power supply to the volatile storage circuit decreases, storage information in the volatile storage circuit is written in the non-volatile storage circuit. Specifically, as the power supply to the volatile storage circuit decreases, and if the storage information in the volatile storage circuit tends to be extinguished, the storage information in the volatile-storage circuit is written in the non-volatile storage circuit so that the storage information can be prevented from being extinguished.

In the invention according to at least one embodiment, a composite storage circuit is configured that as a power supply to the volatile storage circuit decreases, a change in storage information in the volatile storage circuit is inhibited. Specifically, as the power supply to the volatile storage circuit decreases, charges are drained from the volatile storage circuit and then the storage information in the volatile storage circuit is changed. With the configuration that a change in storage information in the volatile storage circuit is inhibited, only correct information can be stored in the volatile storage circuit.

In the invention according to at least one embodiment, power reserving means is provided in at least one of the volatile storage circuit and non-volatile storage circuit. Specifically, the power reserving means is provided and the power reserving means supplies a power when the power supply to the volatile storage circuit or non-volatile storage circuit decreases and it becomes difficult to hold storage information in the storage circuit. It is therefore possible to prevent storage information from being extinguished before storage information in the volatile storage circuit is written in the non-volatile storage circuit, and it is possible to prevent a write operation of storage information in the non-volatile storage circuit from not being performed because of a decreased power supply to the non-volatile storage circuit.

In the invention according to at least one embodiment, a composite storage circuit is configured so that storage information in the non-volatile storage circuit is returned to the volatile storage circuit upon restarting power feeding after a power failure or a decreased power supply. Specifically, storage information in the non-volatile storage circuit is returned to the volatile storage circuit whose storage information was once extinguished by a power failure or a decreased power supply. When this storage information is to be used, it is read from the volatile storage circuit having a high read speed.

In the invention according to at least one embodiment, a composite storage circuit is configured so that after storage information in the non-volatile storage circuit is returned to the volatile storage circuit, a power supply to the non-volatile storage circuit is suppressed. Specifically, after the storage information in the non-volatile storage circuit is returned to the volatile storage circuit, the non-volatile storage circuit is not required to operate. As the power supply to the non-volatile storage circuit is suppressed, a power consumption can be suppressed and a low power consumption can be realized.

In the invention according to at least one embodiment, a semiconductor apparatus of the invention is characterized in that the semiconductor apparatus has the above-described composite storage circuit structure. Specifically, by using the semiconductor apparatus having the composite storage circuit structure, electronic or electric apparatuses capable of instant-on and instant-off can be configured easily.

BRIEF DESCRIPTION OF THE DRAWINGS

FIG. 2 is a timing chart illustrating an operation of the circuit diagram shown in FIG. 1.

FIG. 3 is a timing chart illustrating an operation of the circuit diagram shown in FIG. 1.

DESCRIPTION OF THE PREFERRED EMBODIMENT

Figure 1:
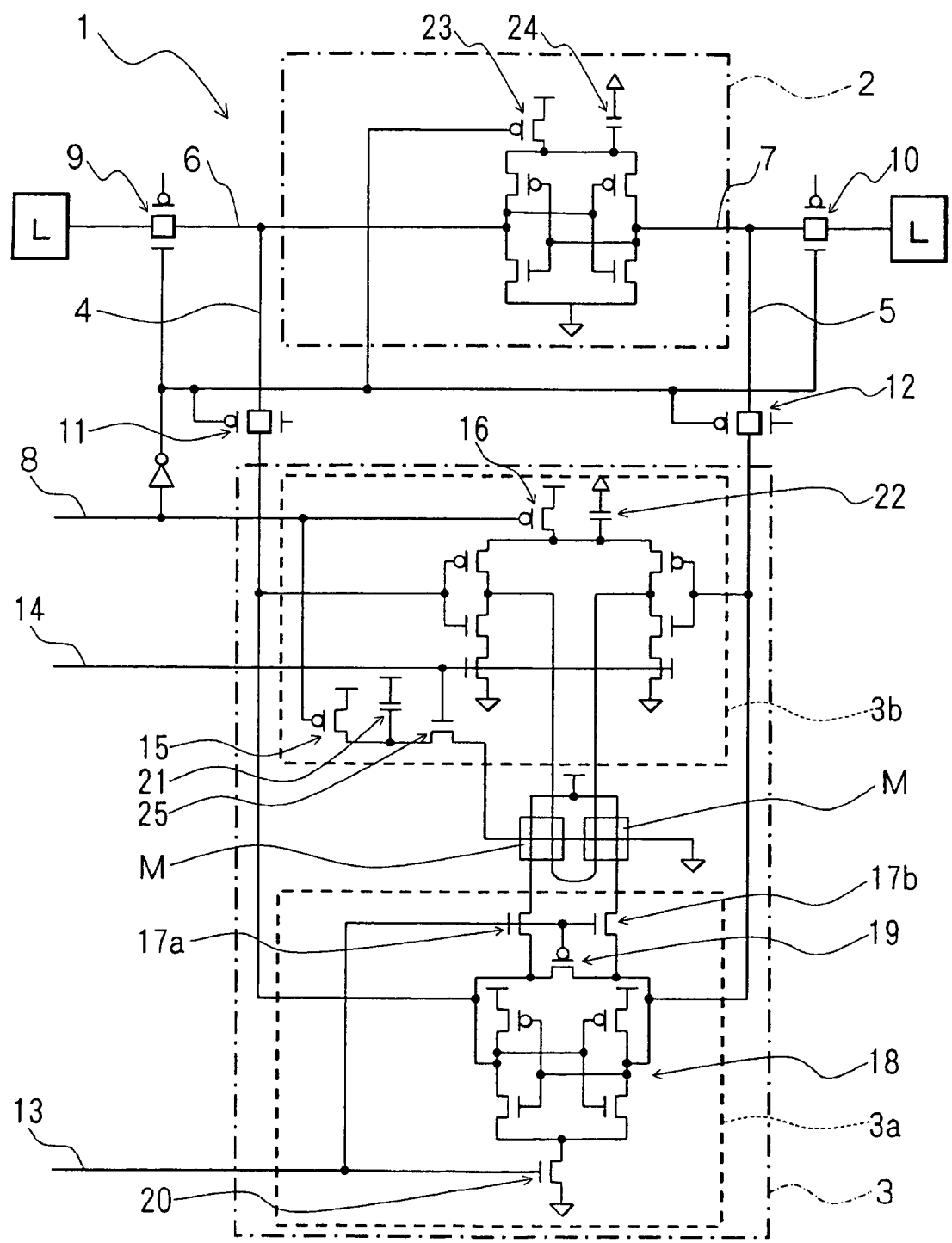
FIG. 1 is a circuit diagram showing an example of a composite storage circuit according to the present invention.

A composite storage circuit according to the invention is constituted of a volatile storage circuit and a non-volatile storage circuit connected in parallel, and the same information as storage information in the volatile storage circuit is stored in the non-volatile storage circuit.

Namely, the volatile storage circuit which can perform a write operation and a read operation of information at high speed although storage information is extinguished as power feeding is stopped, and, on the contrary, the non-volatile storage circuit, which can hold stored information even if power feeding is stopped although the write operation and read operation of information are slower compared to the volatile storage circuit, are connected in parallel and store the same information. Accordingly, a set of the volatile storage circuit and non-volatile storage circuit can constitute a storage circuit which is capable of performing a write operation and a read operation of information at high speed and can hold stored information even if power feeding is stopped.

If a semiconductor apparatus is formed by fabricating the above-described storage circuit on a semiconductor substrate, the semiconductor apparatus can store the state during operation even if a power supply is stopped, and in addition if the power is supplied thereafter again, the state when the power supply was stopped can be recovered at once so that the instant-on function can be realized if an electronic or electric apparatus is structured by using the semiconductor apparatus.

In this case, the volatile storage circuit and the non-volatile storage circuit are not necessarily required to be fabricated on the same semiconductor substrate, but the volatile storage circuit and the non-volatile storage circuit may be fabricated on different semiconductor substrates and connected in parallel by necessary wiring lines.

As the power supply to the volatile storage circuit decreases, storage information in the volatile storage circuit is written in the non-volatile storage circuit.

Namely, as the power to be supplied to the volatile storage circuit decreases, storage information in the volatile storage circuit is written in the non-volatile storage circuit so that the storage information in the volatile storage circuit can be held reliably without being extinguished.

Accordingly, if the semiconductor apparatus is formed by fabricating the composite storage circuit of this kind on a semiconductor substrate, even if the power supply to the semiconductor apparatus is forcibly stopped, the operation can be stopped while storing the operation state of the semiconductor apparatus when the power supply is stopped. Accordingly, if an electronic or electric apparatus is structured by using the semiconductor apparatus, the instant-off function capable of an instant power source disconnection can be provided to the apparatus.

Furthermore, if a change in storage information in the volatile storage circuit is inhibited as the power supply to the volatile storage circuit decreases, it is possible to prevent the information in the volatile storage circuit from being altered, which might be caused by a decreased power supply, and to store correct information in the non-volatile storage circuit.

Further, if power reserving means is provided to at least one of the volatile storage circuit and the non-volatile storage circuit, a power supplied to the volatile storage circuit from the power reserving means can prevent information stored in the volatile storage circuit from being extinguished, whereas a power supplied to the non-volatile storage circuit can prevent the non-volatile storage circuit from becoming unable to perform a write operation, to allow storage information in the volatile storage circuit to be reliably written in the non-volatile storage circuit.

With the configuration that storage information in the non-volatile storage circuit is returned to the volatile storage circuit upon restarting power feeding immediately after a power failure or a decreased power supply, i.e., with the configuration that storage information is read from the non-volatile storage circuit and written in the volatile storage circuit, the volatile storage circuit having a high speed information read speed can be used when information is to be used, by writing storage information in the non-volatile storage circuit into the volatile storage circuit immediately after the volatile storage circuit enters the state capable of holding storage information upon restarting feeding power to the volatile storage circuit. Accordingly, the start-up by the instant-on function of instantly reproducing the operation state of the semiconductor apparatus upon stopping of power feeding can be made faster.

With the configuration that after storage information in the non-volatile storage circuit is returned to the volatile storage circuit, a power supply to the non-volatile storage circuit is suppressed, a power consumption of the non-volatile storage circuit having a larger power consumption than that of the volatile storage circuit can be suppressed, and a low power consumption can be realized, particularly for a semiconductor apparatus having the composite storage circuit.

In the following, with reference to the drawings, an embodiment of the invention will be described in detail. This description will be given specifically in the following order.

1) Description of a composite storage circuit
2) Description of an operation of the composite storage circuit upon stopping of power feeding; and
3) Description of an operation of the composite storage circuit upon restarting power feeding.

In the following description, although a magnetic storage circuit made of magnetic memories is used as a non-volatile storage circuit, the invention is not limited to the magnetic storage circuit, but a non-volatile storage circuit constituted of an EEPROM, a flash memory, a ferroelectrics memory or the like may also be used.

1) Description of the Composite Storage Circuit

FIG. 1 is a circuit diagram of a composite storage circuit 1 according to the present invention. The composite storage circuit 1 is constituted of a volatile storage circuit 2 and a non-volatile storage circuit 3 connected in parallel by a first connection line 4 and a second connection line 5.

In the embodiment, the volatile storage circuit 2 and non-volatile storage circuit 3 are formed on a semiconductor substrate, and the volatile storage circuit 2 is a latch-type storage circuit formed in a system LSI chip.

The volatile storage circuit 2 is connected to a first conductive wire 6 and a second conductive wire 7 that are connected to other storage circuits L or elements. The first conductive wire 6 and the second conductive wire 7 are provided with a first circuit change-over switch 9 and a second circuit change-over switch 10 that are connected to a power source disconnection signal input line 8 and have the structure that open/close change-over is performed by the first circuit change-over switch 9 and second circuit change-over switch 10 in response to an input of a power source disconnection signal from the power source disconnection signal input line 8.

The first connection line 4 with one end connected to the first conductive wire 6 is connected to the first conductive wire 6 between the volatile storage circuit 2 and the first circuit change-over switch 9, and the second connection line 5 with one end connected to the second conductive wire 7 is connected to the second conductive wire 7 between the volatile storage circuit 2 and the second circuit change-over switch 10.

The first connection line 4 and the second connection line 5 are also provided with a third circuit change-over switch 11 and a fourth circuit change-over switch 12 that are connected to the power source disconnection signal input line 8 and have the structure that open/close change over is performed by the third circuit change-over switch 11 and fourth circuit change-over switch 12 in response to an input of a power source disconnection signal from the power source disconnection signal input line 8. The third circuit change-over switch 11 and the fourth circuit change-over switch 12 are disposed between the volatile storage circuit 2 and the non-volatile storage circuit 3.

The non-volatile storage circuit 3 uses the magnetic storage circuit as described above and has the structure that information of "0" or "1" is stored by using magnetic tunnel junction devices M. Since the latch-type storage circuit used as the volatile storage circuit 2 stores information of two bits, two magnetic tunnel junction devices M are provided so that the non-volatile storage circuit 3 can also store information of two bits.

The magnetic tunnel junction devices M are provided with an information read circuit 3a for reading information from the magnetic tunnel junction devices M and an information write circuit 3b for writing information into the magnetic tunnel junction devices M. The information read circuit 3a and the information write circuit 3b are connected to the volatile storage circuit 2 by the first connection line 4 and the second connection line 5.

The information read circuit 3a is connected to a read start signal input line 13 and has the structure that when a read start signal to be described later, is input to the read start signal input line 13, information is read from the magnetic tunnel junction devices M, as will be described later.

The information write circuit 3b is connected to a write start signal input line 14 and has the structure that when a write start signal is input to the write start signal input line 14, the magnetic tunnel junction devices M store storage information of the volatile storage circuit 2, as will described later.

The information write circuit 3b is also connected to the power source disconnection signal input line 8, and, more particularly, the power source disconnection signal input line 8 is connected to a gate terminal of a first switch transistor 15 of the information write circuit 3b and to a gate terminal of a second switch transistor 16.

The volatile storage circuit 2 is also connected to the power source disconnection signal input line 8, and, more particularly, the power source disconnection signal input line 8 is connected to a gate terminal of a third switch transistor 23 of the volatile storage circuit 2.

2) Description of the Composite Storage Circuit Upon Stopping of Power Feeding

With reference to a timing chart shown in FIG. 2, description will be made of the operation of the composite storage circuit 1 upon stopping of power feeding. A power feeding stop state is generated not only by a turn-off of a main power source by a shut-down operation but also by a power failure, an unexpected trouble or the like. However, in the following, a general power feeding stop state will be described, which is disconnection of the main power source by the shut-down operation. The operation mode upon stopping of power feeding is the same irrespective of the reason of power feeding stop.

FIG. 2(a) is a timing chart of a power supply amount upon disconnection of the main power source of the system LSI chip having the composite storage circuit 1. When the power supply amount to the system LSI chip decreases to a predetermined value, a power-off signal generator circuit (not shown) of the system LSI chip starts operating and outputs a power-off signal, as shown in FIG. 2(b).

In response to the power-off signal, a power source disconnection signal generator circuit (not shown) starts operating and outputs a power source disconnection signal, as shown in FIG. 2(c).

The power source disconnection signal on the power source disconnection signal input line 8 is input to the first circuit change-over switch 9, second circuit change-over switch 10, third circuit change-over switch 11 and fourth circuit change-over switch 12.

The first circuit change-over switch 9 and second circuit change-over switch 10 disconnect the first conductive wire 6 and second conductive wire 7 to make the volatile storage circuit 2 be independent from the other storage circuits and elements connected via the first conductive wire 6 and second conductive wire 7, intercept information input to the volatile storage circuit 2 and inhibit storage information in the volatile storage circuit from being altered after the power source disconnection.

Namely, if the first conductive wire 6 and second conductive wire 7 are maintained connected, as the power supplied to the volatile storage circuit 2 decreases, charges are consumed from the drain side of the transistors constituting the volatile storage circuit 2 so that there is a fear of a spontaneous change in the storage information.

Although transfer gates are used as the first circuit change-over switch 9 and second circuit change-over switch 10, any devices may be used if they provide the structure capable of preventing charge consumption of the transistors constituting the volatile storage circuit 2, similar to transfer gates.

On the other hand, the third circuit change-over switch 11 and fourth circuit change-over switch 12 provide a conduction state between the volatile storage circuit 2 and non-volatile storage circuit 3 to allow the storage information to transfer from the volatile storage circuit 2 to the non-volatile storage circuit 3, as will be described later. Although the third circuit change-over switch 11 and fourth circuit change-over switch 12 also use transfer gates, a structure other than transfer gates may also be used.

The power source disconnection signal is also input to the gate terminal of the first switch transistor 15 and the gate terminal of the second switch transistor 16 disposed within the information write circuit 3b of the non-volatile circuit 3, via the power source disconnection signal input line 8. This input of the power source disconnection signal activates a first write operation power source 21 constituted of a capacitor disposed in parallel to the first switch transistor 15 and a second write operation power source 22 constituted of a capacitor disposed in parallel to the second switch transistor 16. With this structure, regardless of a decrease power supplied from the main power source, the write operation by the non-volatile storage circuit 2 is performed reliably by using a write operation power from the first write operation power source 21 and second write operation power source 22. The first write operation power source 21 and second write operation power source 22 constitute a power reserving means.

Further, the power source disconnection signal is also input to the gate terminal of the third switch transistor 23 disposed within the volatile circuit 2 via the power source disconnection signal input line 8. This input of the power source disconnection signal activates an information holding power source 24 constituted of a capacitor disposed in parallel to the third switch transistor 23. Therefore, regardless of a decrease power supplied from the main power source, information in the volatile storage circuit 2 is prevented from being extinguished, by obtaining an information holding power from the information holding power source 24. The information holding power source 24 constitutes a power reserving means.

At the same time when the power source disconnection signal is generated in response to the power-off signal, a write start signal generator circuit (not shown) starts operating to output a write start signal, as shown in FIG. 2(d).

The write start signal is input to the information write circuit 3b via the write start signal input line 14, particularly, to the gate of a write control switch transistor 25 in the information write circuit 3b. With this structure, a first write operation power by the first write operation power source 21 is fed to the magnetic tunnel junction devices M to store the storage information of the volatile storage circuit 2.

The power source disconnection signal and write start signal are generated in response to the power-off signal as described above. As shown in FIG. 2(c) and FIG. 2(d), as the rise of the power disconnection signal is made steeper than the rise of the write start signal, the write operation by the information write circuit 3b in response to the write start signal can be performed after the circuit change-over by the power source disconnection signal, so that the information to be subjected to a write process by the information write circuit 3b will not be destroyed and can be stored correctly.

In the storage holding state shown in FIG. 2(e), the volatile storage circuit 2 holds the storage information until the write operation by the information write circuit 3b is completed, and thereafter, as the power decreases, the storage information is extinguished and a non-holding state enters. The capacity of the capacitor constituting the information holding power source 24 is set in such a manner that the storage information is held until the write operation by the information write circuit 3b is completed.

The above description is the operation to be performed by the composite storage circuit 1 upon stopping of power feeding.

3) Description of the Operation of the Composite Storage Circuit Upon Restarting Power Feeding With reference to a timing chart shown in FIG. 3, description will be made on the operation of the composite storage circuit 1 upon restarting power feeding in the stop state of power feeding.

FIG. 3(a) is a timing chart of a power supply amount supplied to the system LSI chip having the composite storage circuit 1 from the power source upon restarting power feeding. When the power supply amount to the system LSI chip reaches a predetermined value, a power-on-reset circuit (not shown) of the system LSI chip operates and outputs a power-on signal as shown in FIG. 3(b). The power-on signal has a pulse width sufficient for the signal to reach each functional block of the system LSI chip.

A read start signal generator circuit (not shown) generates a read start signal shown in FIG. 3(c) based upon the power-on signal and inputs the read start signal to the read start signal input line 13 of the information read circuit 3a.

In response to an input of the read start signal, the information read circuit 3a operates. Namely, the read start signal is input to a gate of a first read operation switch transistor 17a and a gate of a second read operation switch transistor 17b, respectively, of the information read circuit 3a to read information from the magnetic tunnel junction devices M.

The read information is amplified by a sense amplifier circuit 18 provided in the information read circuit 3a and input to the volatile storage circuit 2 via the first connection line 4 and second connection line 5. The sense amplifier circuit 18 is provided with an equalizer transistor 19 and a switch transistor 20, and gates of the transistors 19 and 20 are connected to the read start signal input line 13 to input the read start signal. With this structure, the sense amplifier circuit 18 performs an amplification process based upon an input of the read start signal.

The read start signal is set in such a manner that it operates during the time sufficient for the information read circuit 3a to read information from the magnetic tunnel junction devices M. Therefore, the non-volatile storage circuit 3 having the information read circuit 3a operates only during a predetermined time after activation and stops its operation thereafter, so that an excessive power consumption can be suppressed and a low power consumption can be realized.

On the other hand, in the storage holding state shown in FIG. 3(d), the volatile storage circuit 2 performs an initial clear process C based upon the power-on signal, and then as the storage information is input from the information read circuit 3a, the volatile storage circuit 2 stores and holds the input storage information.

The above description is the operation to be performed by the composite storage circuit 1 upon restarting power feeding.

INDUSTRIAL USABILITY (1) In the invention according to at least one embodiment, a storage circuit is constituted of a volatile storage circuit and a non-volatile storage circuit connected in parallel, and the same information as storage information in the volatile storage circuit is stored in the non-volatile storage circuit. Accordingly, the volatile storage circuit is used for normal information read and write, whereas if storage information in the volatile storage circuit tends to be extinguished in a power feeding stop state, the same information as the storage information in the volatile storage circuit can be stored in the non-volatile storage circuit. It is therefore possible to provide the composite storage circuit capable of continuing to hold storage information even upon stopping of power feeding while the speed of information read and write operations is maintained at high speed.

In the invention according to at least one embodiment, a storage circuit is configured so that as a power supply to the volatile storage circuit decreases, storage information in the volatile storage circuit is written in the non-volatile storage circuit. Accordingly, as the power supply to the volatile storage circuit decreases, and if the storage information in the volatile storage circuit tends to be extinguished, the storage information can be written in the non-volatile storage circuit so that it is possible to provide the composite storage circuit capable of preventing the storage information from being extinguished.

In the invention according to at least one embodiment, a storage circuit is configured so that as a power supply to the volatile storage circuit decreases, a change in storage information in the volatile storage circuit is inhibited. Accordingly, a change in storage information in the volatile storage circuit caused by a decreased power supply to the volatile storage circuit is inhibited so that it is possible to provide the composite storage circuit capable of writing correct information in the non-volatile storage circuit.

In the invention according to at least one embodiment, power reserving means is provided in at least one of the volatile storage circuit and non-volatile storage circuit. Accordingly, since the power reserving means is provided, the power reserving means supplies a power when it becomes difficult to hold storage information in the volatile storage circuit or when the non-volatile storage circuit cannot perform a write operation, respectively, because of a decreased power supply. It is therefore possible that the volatile storage circuit can hold storage information until it is written in the non-volatile storage circuit and that the non-volatile storage circuit can operate until storage information in the volatile storage circuit is completely written. The composite storage circuit can be provided which can reliably write storage information in the volatile-storage circuit to the non-volatile storage circuit.

In the invention according to at least one embodiment, a storage circuit is configured that storage information in the non-volatile storage circuit is returned to the volatile storage circuit upon restarting power feeding after a power failure or a decreased power supply. Accordingly, by returning storage information in the non-volatile storage circuit to the volatile storage circuit whose storage information was once extinguished by a power failure or a decreased power supply, it is possible to provide the composite storage circuit capable of reading storage information from the volatile storage circuit having a high read speed when the storage information is to be used.

In the invention according to at least one embodiment, a storage circuit is configured so that after storage information in the non-volatile storage circuit is returned to the volatile storage circuit, a power supply to the non-volatile storage circuit is suppressed. Accordingly, after the storage information in the non-volatile storage circuit is returned to the volatile storage circuit, the power supply to the non-volatile storage circuit not required to operate is suppressed. It is therefore possible to provide the composite storage circuit capable of suppressing the power supply and power consumption.

In the invention according to at least one embodiment, the semiconductor apparatus of the invention is characterized in that the semiconductor apparatus has the above-described composite storage circuit structure. It is therefore possible to provide the semiconductor apparatus capable of providing an instant-on function and an instant-off function to electronic or electric apparatuses having the built-in semiconductor apparatus. The semiconductor apparatus can be provided which can reliably hold a storage state before an abrupt stop of power feeding, such as a power failure, and which can improve convenience of use considerably.

The invention claimed is:

1. A composite storage circuit characterized by configuring a storage circuit such that a volatile storage circuit and a non-volatile storage circuit are connected in parallel through a switching device,
   wherein said volatile storage circuit and said non-volatile storage circuit store like information, and said switching device is connected between said volatile storage circuit and said non-volatile circuit when a power feed is stopped, and
   wherein said non-volatile storage circuit includes a couple of magnetic tunnel junction devices.

2. The composite storage circuit according to claim 1, wherein said couple of magnetic tunnel junction devices have a power source that writes the information of said volatile memory to said non-volatile memory when said power feed is stopped.

3. The composite storage circuit according to claim 1, wherein said non-volatile storage circuit has an information write circuit that writes the information of said volatile memory to said non-volatile memory.

4. The composite storage circuit according to claim 3, wherein said information write circuit has a power source that sustains the information of said volatile memory for a predetermined time after said power feed is stopped.

5. The composite storage circuit according to claim 3, wherein said non-volatile storage circuit has a power source that writes the information of said volatile memory to said couple of magnetic tunnel junction devices when said power feed is stopped.

6. The composite storage circuit according to claim 3, wherein said non-volatile storage circuit has an information read circuit.

7. The composite storage circuit according to claim 6, wherein said information write circuit has a power source that writes the information of said volatile memory to a non-volatile memory when said power feed is stopped.

8. The composite storage circuit according to claim 6, wherein said non-volatile storage circuit has a power source that writes the information of said volatile memory to said couple of magnetic tunnel junction devices when said power feed is stopped.

9. A composite storage circuit characterized by configuring a storage circuit such that a volatile storage circuit and a non-volatile storage circuit are connected in parallel through a switching device,
   wherein the said volatile storage circuit and said non-volatile storage circuit store like information, and said switching device is connected between said volatile storage circuit and said non-volatile circuit when a power feed is stopped, and said volatile storage circuit has a power source that sustains the information of said volatile memory for a predetermined time after said power feed is stopped, and
   wherein said non-volatile storage circuit includes a couple of magnetic tunnel junction devices.

10. The composite storage circuit according to claim 9, wherein said couple of magnetic tunnel junction devices have a power source that writes the information of said volatile memory to said non-volatile memory when said power feed is stopped.

11. The composite storage circuit according to claim 9, wherein said non-volatile storage circuit has an information write circuit that writes the information of said volatile memory to said non-volatile memory.

12. The composite storage circuit according to claim 11, wherein said information write circuit has a power source that sustains the information of said volatile memory for a predetermined time after said power feed is stopped.

13. The composite storage circuit according to claim 11, wherein said non-volatile storage circuit has a power source that writes the information of said volatile memory to said couple of magnetic tunnel junction devices when said power feed is stopped.

14. The composite storage circuit according to claim 11, wherein said non-volatile storage circuit has an information read circuit.

15. The composite storage circuit according to claim 14, wherein said information write circuit has a power source that writes the information of said volatile memory to a non-volatile memory when said power feed is stopped.

16. The composite storage circuit according to claim 14, wherein said non-volatile storage circuit has a power source that writes the information of said volatile memory to said couple of magnetic tunnel junction devices when said power feed is stopped.

17. The composite storage circuit according to claim 1, wherein, upon the presence of said power feed, said switching device is adapted to disconnect said volatile storage circuit from said non-volatile storage circuit.

18. A composite storage circuit comprising:
   a volatile storage circuit; a non-volatile storage circuit; and a switching device,
   wherein, upon the presence of a power feed, said switching device is adapted to disconnect said volatile storage circuit from said non-volatile storage circuit, and
   wherein, upon a stoppage of said power feed, said volatile storage circuit and said non-volatile storage circuit are connected in parallel.

19. The composite storage circuit according to claim 18, wherein, upon a stoppage of said power feed, said switching device is adapted to connect said volatile storage circuit with said non-volatile storage circuit.

20. The composite storage circuit according to claim 18, upon a stoppage of said power feed, the information of said volatile storage circuit is written to said non-volatile storage circuit.

21. The composite storage circuit according to claim 20, wherein said volatile storage circuit has a power source, said power source sustaining said information of said volatile storage circuit for a predetermined time after said stoppage.

22. A composite storage circuit comprising:
   a volatile storage circuit; a non-volatile storage circuit; and a switching device,
   wherein, upon the presence of a power feed, said switching device is adapted to disconnect said volatile storage circuit from said non-volatile storage circuit,
   wherein said non-volatile storage circuit includes at least one magnetic tunnel junction device.

23. The composite storage circuit according to claim 22, wherein, upon a stoppage of said power feed, said at least one magnetic tunnel junction device is adapted to write of said volatile information to said non-volatile memory.

* * * * *

UNITED STATES PATENT AND TRADEMARK OFFICE
CERTIFICATE OF CORRECTION

PATENT NO. : 7,385,845 B2  Page 1 of 1
APPLICATION NO. : 10/503442
DATED : June 10, 2008
INVENTOR(S) : Katsutoshi Moriyama et al.

It is certified that error appears in the above-identified patent and that said Letters Patent is hereby corrected as shown below:

Title Page:
Item (54) should read:
-- COMPOSITE STORAGE CIRCUIT AND SEMICONDUCTOR APPARATUS HAVING THE COMPOSITE STORAGE CIRCUIT --.

Signed and Sealed this

Thirtieth Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,385,845 B2  Page 1 of 1
APPLICATION NO. : 10/503442
DATED : June 10, 2008
INVENTOR(S) : Katsutoshi Moriyama et al.

It is certified that error appears in the above-identified patent and that said Letters Patent is hereby corrected as shown below:

Title Page:
Item (54) and Column 1, lines 1-3 should read:
-- COMPOSITE STORAGE CIRCUIT AND SEMICONDUCTOR APPARATUS HAVING THE COMPOSITE STORAGE CIRCUIT --.

This certificate supersedes the Certificate of Correction issued September 30, 2008.

Signed and Sealed this

Twenty-first Day of October, 2008

JON W. DUDAS
*Director of the United States Patent and Trademark Office*